(12) United States Patent
Cok et al.

(10) Patent No.: US 10,150,325 B2
(45) Date of Patent: Dec. 11, 2018

(54) HYBRID BANKNOTE WITH ELECTRONIC INDICIA

(71) Applicant: X-Celeprint Limited, Cork (IE)

(72) Inventors: Ronald S. Cok, Rochester, NY (US); Robert R. Rotzoll, Colorado Springs, CO (US); Christopher Bower, Raleigh, NC (US); Mark Willner, Denver, CO (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/433,119

(22) Filed: Feb. 15, 2017

(65) Prior Publication Data

US 2017/0246899 A1     Aug. 31, 2017

Related U.S. Application Data

(60) Provisional application No. 62/301,211, filed on Feb. 29, 2016.

(51) Int. Cl.
*H01L 33/44*      (2010.01)
*H01L 33/40*      (2010.01)
(Continued)

(52) U.S. Cl.
CPC ........... *B42D 25/305* (2014.10); *B42D 25/29* (2014.10); *B42D 25/30* (2014.10); *B42D 25/485* (2014.10);
(Continued)

(58) Field of Classification Search
CPC . B42D 25/29; B42D 2033/46; B42D 2033/26
(Continued)

(56) References Cited

U.S. PATENT DOCUMENTS 5,394,969 A    3/1995  Harbaugh
5,550,066 A    8/1996  Tang et al.
(Continued)

FOREIGN PATENT DOCUMENTS

DE    102013102003 A1    8/2014
EP       1 560 718 B1    3/2007
(Continued)

OTHER PUBLICATIONS

International Search Report, PCT/EP2017/054537, 4 pages, Jun. 30, 2017.
(Continued)

*Primary Examiner* — Shin H Kim
(74) *Attorney, Agent, or Firm* — William R. Haulbrook; Michael D. Schmitt; Choate, Hall & Stewart LLP

(57) ABSTRACT

A hybrid currency banknote includes a banknote having visible markings. One or more light-controlling elements and a controller are embedded in or on the banknote. The controller is electrically connected to the one or more light-controlling elements to control the one or more light-controlling elements. A power input connection is electrically connected to the controller, or one or more light-controlling elements, or both. A power source can be connected to the power input connection, for example a piezoelectric or photovoltaic power source. In response to applied power, the controller causes the one or more light-controlling elements to emit light. A value can be stored in a memory in the controller and displayed by the light-controlling elements. The value can be assigned or varied by a hybrid currency teller machine.

17 Claims, 13 Drawing Sheets

(51) Int. Cl.
    *B42D 25/305*   (2014.01)
    *B42D 25/29*    (2014.01)
    *G07D 11/00*    (2006.01)
    *B42D 25/30*    (2014.01)
    *B42D 25/485*   (2014.01)

(52) U.S. Cl.
    CPC ..... *G07D 11/0021* (2013.01); *G07D 11/0054* (2013.01); *G07D 11/0066* (2013.01)

(58) Field of Classification Search
    USPC .............................................. 257/88, 89, 98
    See application file for complete search history.

(56) References Cited

U.S. PATENT DOCUMENTS

| | | | |
|---|---|---|---|
| 5,621,555 | A | 4/1997 | Park |
| 5,815,303 | A | 9/1998 | Berlin |
| 5,994,722 | A | 11/1999 | Averbeck et al. |
| 6,084,579 | A | 7/2000 | Hirano |
| 6,131,718 | A | 10/2000 | Witschorik |
| 6,169,294 | B1 | 1/2001 | Biing-Jye et al. |
| 6,184,477 | B1 | 2/2001 | Tanahashi |
| 6,278,242 | B1 | 8/2001 | Cok et al. |
| 6,392,340 | B2 | 5/2002 | Yoneda et al. |
| 6,466,281 | B1 | 10/2002 | Huang et al. |
| 6,577,367 | B2 | 6/2003 | Kim |
| 6,659,351 | B1 | 12/2003 | Bailleu et al. |
| 6,660,457 | B1 | 12/2003 | Imai et al. |
| 6,703,780 | B2 | 3/2004 | Shiang et al. |
| 6,717,560 | B2 | 4/2004 | Cok et al. |
| 6,756,576 | B1 | 6/2004 | McElroy et al. |
| 6,812,637 | B2 | 11/2004 | Cok et al. |
| 6,828,724 | B2 | 12/2004 | Burroughes |
| 6,933,532 | B2 | 8/2005 | Arnold et al. |
| 7,012,382 | B2 | 3/2006 | Cheang et al. |
| 7,091,523 | B2 | 8/2006 | Cok et al. |
| 7,098,589 | B2 | 8/2006 | Erchak et al. |
| 7,129,457 | B2 | 10/2006 | McElroy et al. |
| 7,195,733 | B2 | 3/2007 | Rogers et al. |
| 7,288,753 | B2 | 10/2007 | Cok |
| 7,402,951 | B2 | 7/2008 | Cok |
| 7,420,221 | B2 | 9/2008 | Nagai |
| 7,466,075 | B2 | 12/2008 | Cok et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,622,367 | B1 | 11/2009 | Nuzzo et al. |
| 7,662,545 | B2 | 2/2010 | Nuzzo et al. |
| 7,687,812 | B2 | 3/2010 | Louwsma et al. |
| 7,688,270 | B2 | 3/2010 | Tsushima |
| 7,704,684 | B2 | 4/2010 | Rogers et al. |
| 7,791,271 | B2 | 9/2010 | Cok et al. |
| 7,799,699 | B2 | 9/2010 | Nuzzo et al. |
| 7,816,856 | B2 | 10/2010 | Cok et al. |
| 7,834,541 | B2 | 11/2010 | Cok |
| 7,861,937 | B2 | 1/2011 | Lazzerini |
| 7,893,612 | B2 | 2/2011 | Cok |
| 7,919,342 | B2 | 4/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,969,085 | B2 | 6/2011 | Cok |
| 7,972,875 | B2 | 7/2011 | Rogers et al. |
| 7,982,296 | B2 | 7/2011 | Nuzzo et al. |
| 7,990,058 | B2 | 8/2011 | Cok et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,056,820 | B2 | 11/2011 | Camus et al. |
| 8,198,621 | B2 | 6/2012 | Rogers et al. |
| 8,207,547 | B2 | 6/2012 | Lin |
| 8,243,027 | B2 | 8/2012 | Hotelling et al. |
| 8,253,536 | B2 * | 8/2012 | Kaminska .............. B42D 25/29 340/5.86 |
| 8,261,660 | B2 | 9/2012 | Menard |
| 8,288,843 | B2 | 10/2012 | Kojima et al. |
| 8,334,545 | B2 | 12/2012 | Levermore et al. |
| 8,391,688 | B2 | 3/2013 | Zhang et al. |
| 8,394,706 | B2 | 3/2013 | Nuzzo et al. |
| 8,440,546 | B2 | 5/2013 | Nuzzo et al. |
| 8,450,927 | B2 | 5/2013 | Lenk et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,528,813 | B1 | 9/2013 | Blossom |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,735,932 | B2 | 5/2014 | Kim et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,791,822 | B2 | 7/2014 | Delia et al. |
| 8,794,501 | B2 | 8/2014 | Bibl et al. |
| 8,803,857 | B2 | 8/2014 | Cok |
| 8,817,369 | B2 | 8/2014 | Daiku |
| 8,854,294 | B2 | 10/2014 | Sakariya |
| 8,860,051 | B2 | 10/2014 | Fellows et al. |
| 8,877,648 | B2 | 11/2014 | Bower et al. |
| 8,884,844 | B2 | 11/2014 | Yang et al. |
| 8,889,485 | B2 | 11/2014 | Bower |
| 8,895,406 | B2 | 11/2014 | Rogers et al. |
| 8,902,152 | B2 | 12/2014 | Bai et al. |
| 8,946,760 | B2 | 2/2015 | Kim |
| 8,987,765 | B2 | 3/2015 | Bibl et al. |
| 9,153,171 | B2 | 10/2015 | Sakariya et al. |
| 9,202,996 | B2 | 12/2015 | Orsley et al. |
| 9,460,665 | B2 * | 10/2016 | Jiang ................... G09G 3/3413 |
| 9,520,537 | B2 | 12/2016 | Bower et al. |
| 9,626,908 | B2 | 4/2017 | Sakariya et al. |
| 2001/0022564 | A1 | 9/2001 | Youngquist et al. |
| 2002/0096994 | A1 | 7/2002 | Iwafuchi et al. |
| 2003/0164611 | A1 | 9/2003 | Schneider et al. |
| 2004/0061572 | A1 | 4/2004 | Nakamura |
| 2004/0212296 | A1 | 10/2004 | Nakamura et al. |
| 2004/0227704 | A1 | 11/2004 | Wang et al. |
| 2004/0252933 | A1 | 12/2004 | Sylvester et al. |
| 2005/0006657 | A1 | 1/2005 | Terashita |
| 2005/0012076 | A1 | 1/2005 | Morioka |
| 2005/0116621 | A1 | 6/2005 | Bellmann et al. |
| 2005/0140275 | A1 | 6/2005 | Park |
| 2005/0150740 | A1 | 7/2005 | Finkenzeller et al. |
| 2005/0168987 | A1 | 8/2005 | Tamaoki et al. |
| 2005/0177480 | A1 | 8/2005 | Huang |
| 2005/0275615 | A1 | 12/2005 | Kahen et al. |
| 2006/0063309 | A1 | 3/2006 | Sugiyama et al. |
| 2007/0035340 | A1 | 2/2007 | Kimura |
| 2007/0077349 | A1 | 4/2007 | Newman et al. |
| 2007/0201056 | A1 | 8/2007 | Cok et al. |
| 2008/0035736 | A1 | 2/2008 | Tompkin et al. |
| 2008/0211734 | A1 | 9/2008 | Huitema et al. |
| 2009/0315054 | A1 | 12/2009 | Kim et al. |
| 2010/0078670 | A1 | 4/2010 | Kim et al. |
| 2010/0084850 | A1 * | 4/2010 | Jackson ................ B42D 25/29 283/83 |
| 2010/0123268 | A1 | 5/2010 | Menard |
| 2010/0148198 | A1 | 6/2010 | Sugizaki et al. |
| 2010/0214247 | A1 | 8/2010 | Tang et al. |
| 2010/0248484 | A1 | 9/2010 | Bower et al. |
| 2010/0258710 | A1 | 10/2010 | Wiese et al. |
| 2010/0317132 | A1 | 12/2010 | Rogers et al. |
| 2011/0211348 | A1 | 9/2011 | Kim |
| 2012/0119249 | A1 | 5/2012 | Kim et al. |
| 2012/0223875 | A1 | 9/2012 | Lau et al. |
| 2012/0228669 | A1 | 9/2012 | Bower et al. |
| 2012/0314388 | A1 | 12/2012 | Bower et al. |
| 2013/0015483 | A1 | 1/2013 | Shimokawa et al. |
| 2013/0069275 | A1 | 3/2013 | Menard et al. |
| 2013/0088416 | A1 | 4/2013 | Smith et al. |
| 2013/0196474 | A1 | 8/2013 | Meitl et al. |
| 2013/0207964 | A1 | 8/2013 | Fleck et al. |
| 2013/0221355 | A1 | 8/2013 | Bower et al. |
| 2013/0273695 | A1 | 10/2013 | Menard et al. |

(56) References Cited

U.S. PATENT DOCUMENTS

| | | |
|---|---|---|
| 2014/0104243 A1 | 4/2014 | Sakariya et al. |
| 2014/0175498 A1 | 6/2014 | Lai |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0300095 A1* | 10/2014 | Tompkin ............... B42D 25/30 283/67 |
| 2014/0306248 A1 | 10/2014 | Ahn et al. |
| 2014/0367633 A1 | 12/2014 | Bibl et al. |
| 2014/0367705 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0363614 A1 | 12/2015 | Yeager et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0373793 A1 | 12/2015 | Bower et al. |
| 2016/0004947 A1 | 1/2016 | Pueschner et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0068005 A1* | 3/2016 | Fischer ............... B42D 25/305 283/83 |
| 2016/0093600 A1 | 3/2016 | Bower et al. |
| 2017/0206845 A1 | 7/2017 | Sakariya et al. |
| 2017/0301282 A1 | 10/2017 | Rotzoll et al. |
| 2017/0302336 A1 | 10/2017 | Rotzoll et al. |
| 2017/0313119 A1 | 11/2017 | Cok et al. |
| 2017/0345243 A1 | 11/2017 | Rotzoll et al. |

FOREIGN PATENT DOCUMENTS

| | | |
|---|---|---|
| EP | 2 062 204 B1 | 3/2012 |
| EP | 1 059 620 B1 | 2/2013 |
| EP | 1 301 355 B2 | 11/2015 |
| GB | 2 496 183 A | 5/2013 |
| WO | WO-2004/056583 A1 | 7/2004 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2016/037895 A1 | 3/2016 |
| WO | WO-2017/148875 A1 | 9/2017 |

OTHER PUBLICATIONS

Lee, S. H. etal, Laser Lift-Offof GaN Thin Film and its Application to the Flexible Light Emitting Diodes, Proc. of SPIE 8460:846011-1-846011-6 (2012).

Roscher, H., VCSEL Arrays with Redundant Pixel Designs for 10Gbits/s 2-D Space-Parallel MMF Transmission, Annual Report, optoelectronics Department, (2005).

Written Opinion, PCT/EP2017/054537, 7 pages, dated Jun. 30, 2017.

Yaniv et al., a 640×480 Pixel Computer Display Using Pin Diodes with Device Redundancy, 1988 International Display Research Conference, IEEE, CH-2678-1/88:152-154 (1988).

\* cited by examiner

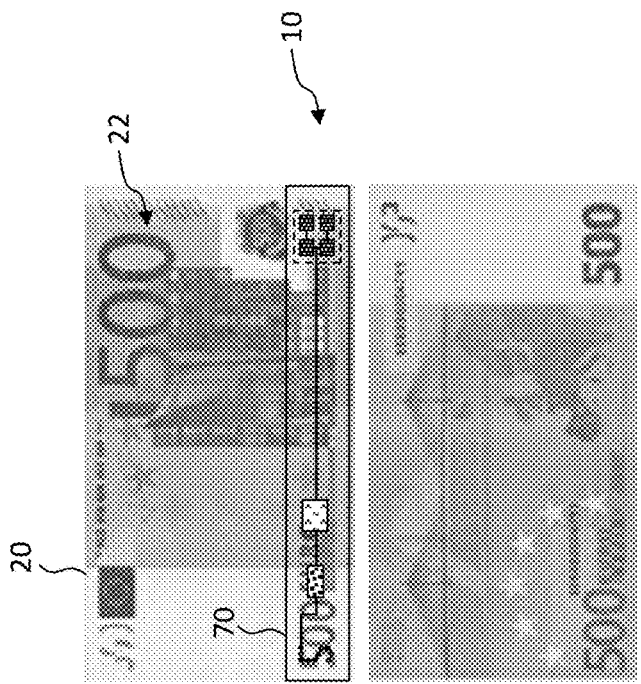
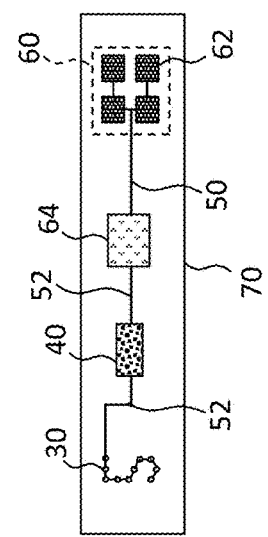
FIG. 2
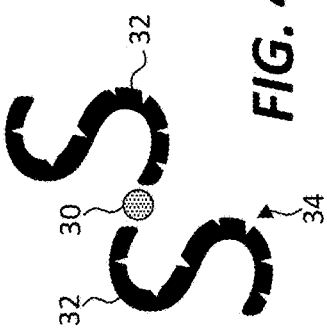
FIG. 4
FIG. 3

HYBRID BANKNOTE WITH ELECTRONIC INDICIA

PRIORITY APPLICATION

This application claims priority to and benefit of U.S. Patent Application No. 62/301,211, filed Feb. 29, 2016, entitled Hybrid Banknote with Electronic Indicia, the content of which is hereby incorporated by reference in its entirety.

FIELD OF THE INVENTION

The present invention relates to currency and particularly to banknotes having electronically controlled inorganic light-emitting diodes embedded in the banknotes.

BACKGROUND OF THE INVENTION

Monetary instruments issued by governments such as money or currency are used throughout the world today. Government-issued currency typically includes banknotes (also known as paper currency or bills) having visible markings printed on high-quality paper, plastic, or paper impregnated with other materials, such as plastic. The visible markings indicate the denomination (value) of the banknote, includes a serial number, and has decorations such as images, and anti-counterfeiting structures such as special threads, ribbons, and holograms. Currency circulates within an economic system as a medium of monetary exchange having a fixed value until it is physically worn out. Worn out banknotes are generally returned by banks or other financial institutions and then replaced.

Other privately issued monetary instruments are also used, such as credit cards and gift cards. These cards typically include an electronically accessible value (e.g., stored in a magnetic stripe or in a chip in the card) or an electronically accessible account that can be used to make purchases. However, the value of the card is not readily viewed by a user without special equipment, such as a reader.

In the past, banknotes have not been electronically enabled. However, more recently there have been proposals to use RFID (radio-frequency identification device) in banknotes to validate the banknote and avoid counterfeiting. For example, U.S. Pat. No. 8,391,688 and U.S. Pat. No. 8,791,822 disclose systems for currency validation. U.S. Pat. No. 5,394,969 describes a capacitance-based verification device for a security thread embedded within currency paper to defeat counterfeiting. Security systems for scanning a paper banknote and checking identification information in the banknote (e.g., the serial number) with a network-accessible database have been proposed, for example in U.S. Pat. No. 6,131,718. In all of these systems, however, there is no way to visibly test small details of a banknote without using a separate electronic or optical reader.

There remains a need therefore, for currency providing a variable value that is electronically accessible with visible indicia without using a separate electronic or optical reader.

SUMMARY OF THE INVENTION

The present invention provides a hybrid document, for example a currency banknote, having visible markings and one or more light-controlling elements, for example inorganic light-emitting diodes (iLEDs), and a controller embedded in or on the banknote and electrically connected to control the light-controlling elements to emit light. A power input connection is electrically connected to the controller, or one or more light-controlling elements, or both. In a further embodiment, a power source, such as a piezoelectric or photovoltaic device, is electrically connected to the power input connection, with or without a power convertor. In various embodiments, the visible markings include printed images or value indicators. The light-controlling elements can form a graphic indicator such as a number, letter, or pictogram or can highlight a visible marking on the banknote. The light-controlling elements can form a display, for example a monochrome or full-color display.

In one embodiment, the light-controlling elements or controller are printed on the pre-printed banknote. In another embodiment, the light-controlling elements or controller is printed on a ribbon or thread that is subsequently woven or otherwise incorporated into the banknote. The ribbon or thread can also include electrical conductors to electrically connect the controller, the light-controlling elements, and the power source in a circuit. When operated by applying power, the controller controls the light-controlling elements to emit light, for example in a spatial pattern, or in a temporal pattern (for example with flashing lights or sequentially flashing lights), or both. Different light-controlling elements 30 can be activated in response to sequential squeezes of the piezoelectric power source 60.

The currency can also include light pipes (optical waveguides) arranged in association with the light-controlling elements. The light pipes can conduct light to desired locations on the banknote or can form patterns such as graphic indicators. The light pipes can include light-emitting portions, for example diffusers, along the length of the light pipes to emit light at locations along the length of the light pipe as well as at the end of the light pipe.

The controller can include a memory, for example a read-only memory or a write-once memory storing one or more values and the light-controlling elements can be controlled to display numerals corresponding to the values. Multiple values can be stored in a sequential order corresponding to a temporally sequential set of values and can monotonically decline in magnitude. Values stored in the banknote can be electronically read by a teller machine having a reader and the value of the banknote displayed on the teller machine. In a further embodiment, the teller machine can write a value to the banknote using a writer. In an embodiment, the controller controls the written value so that it must be equal to or smaller than a value already stored in the banknote.

A method of making a hybrid currency banknote includes providing a banknote having visible markings, a wafer having a plurality of micro-transfer printable light-controlling elements, and a wafer having a plurality of controllers. One or more of the light-controlling elements and at least one controller are embedded in the banknote, for example by micro-transfer printing onto the banknote or onto a thread or ribbon that is subsequently incorporated into the banknote. The controller is electrically connected to the one or more light-controlling elements and to a power input connection. A power source can also be provided, for example by micro-transfer printing the power source on the banknote or ribbon. An issuer of the hybrid currency banknote can provide a memory with a value or write the value to a memory in the banknote to provide the banknote with a value.

The hybrid currency banknote of the present invention can be used by receiving the banknote and providing power to the power input connection, for example by a teller machine that then displays the value of the banknote on the banknote itself or on a display incorporated into the teller machine. Alternatively, the banknote includes a piezoelectric power source and upon squeezing the power source the controller controls the light-controlling elements to emit light. In another embodiment, the banknote includes a photovoltaic power source and upon exposure to electromagnetic radiation (such as infrared or ultraviolet radiation), the controller controls the light-controlling elements to emit light.

A user can insert a received banknote into a teller machine, input an input value to the teller machine, and the teller machine can write a value derived from the input value into the banknote. The input value can represent the value of a monetary transaction, for example a purchase of goods or payment of debt and the difference between the input value and the current value can be written into the hybrid currency banknote.

The present invention provides an anonymous, government-issued currency with anti-counterfeiting light emitters whose value can be visibly ascertained without requiring specialized equipment and modified electronically.

In one aspect, the disclosed technology includes a hybrid currency banknote, including: a banknote having visible markings; one or more light-emitting elements embedded in or on the banknote; a controller embedded in or on the banknote electrically connected to the one or more light-controlling elements for controlling the one or more light-controlling elements; and a power input connection electrically connected to the controller, or one or more light-emitting elements, or both.

In certain embodiments, the light-controlling elements are light-emitting elements, light-reflecting elements, inorganic light-emitting diodes, organic light-emitting diodes, microelectromechanical reflective elements, reflective electrophoretic elements, or reflective electrochromic display elements.

In certain embodiments, the banknote includes a power source connected to the power input connection.

In certain embodiments, the power source is a piezoelectric power source or a photovoltaic power source.

In certain embodiments, the power source is indicated by the visible markings, the power source forms a part of the visible markings, or the power source is obscured by the visible markings.

In certain embodiments, the power source comprises a plurality of electrically connected individual power source components.

In certain embodiments, the banknote includes a power convertor connected to the power input connection and the controller or one or more light-controlling elements.

In certain embodiments, the banknote is a government-issued banknote indicated by the visible markings.

In certain embodiments, the banknote includes a flexible substrate that includes paper, plastic, or impregnated paper, and the one or more light-controlling elements and the controller are printed on the flexible substrate.

In certain embodiments, the banknote includes a ribbon or thread woven into the banknote and the and the one or more light-controlling elements and the controller are printed on the ribbon or thread.

In certain embodiments, the ribbon or thread or portions of the ribbon or thread are at least partially electrically conductive or include conductive wires.

In certain embodiments, the one or more light-controlling elements, the controller, or both the one or more light-controlling elements and the controller include at least a portion of a tether.

In certain embodiments, the one or more light-controlling elements are disposed in a location corresponding to a portion of the visible markings to highlight or otherwise indicate the portion of the visible markings.

In certain embodiments, the one or more light-controlling elements are disposed to form a graphic indicator.

In certain embodiments, the graphic indicator is any of one or more of a number, a letter, and a pictogram.

In certain embodiments, the graphic indicator indicates a value, a date, or a person.

In certain embodiments, the banknote includes one or more light pipes located in association with the one or more light-controlling elements.

In certain embodiments, the light pipes include portions that leak light at desired locations.

In certain embodiments, the one or more light pipes are disposed in a location or arranged in a pattern corresponding to a portion of the visible markings to highlight or otherwise indicate the portion of the visible markings.

In certain embodiments, the one or more light pipes are disposed to form a graphic indicator.

In certain embodiments, the graphic indicator is any of one or more of a number, a letter, and a pictogram.

In certain embodiments, the graphic indicator indicates a value, a date, or a person.

In certain embodiments, the controller controls the one or more light-controlling elements to flash or flash sequentially.

In certain embodiments, the one or more light-controlling elements include inorganic light-emitting diodes that emit different colors of light.

In certain embodiments, the different colors of light include red, green, and blue.

In certain embodiments, the one or more light-controlling elements forms a display or a two-dimensional array.

In certain embodiments, the visible markings do not include a value.

In certain embodiments, the one or more light-controlling elements are arranged to indicate a value.

In certain embodiments, the controller includes protective layers disposed over at least one or more portions of the controller.

In certain embodiments, the controller includes a circuit having a memory that stores a value and the circuit causes the one or more light-controlling elements to indicate the value or the memory stores an electronic serial number.

In certain embodiments, the memory is a read-only memory.

In certain embodiments, the memory is a write-once memory that stores multiple values in memory locations that are ordered in a sequential order.

In certain embodiments, the banknote is adapted to a teller machine that writes a value into the memory in a location sequentially after the previous written value.

In certain embodiments, the one or more light-controlling elements or the controller has a width from 2 to 5 μm, 5 to 10 μm, 10 to 20 μm, or 20 to 50 μm, a length from 2 to 5 μm, 5 to 10 μm, 10 to 20 μm, or 20 to 50 μm, or a height from 2 to 5 μm, 4 to 10 μm, 10 to 20 μm, or 20 to 50 μm.

In another aspect, the disclosed technology includes a hybrid currency teller machine, including an optional display and a reader adapted to accept the hybrid currency banknote (e.g., as described above), read one or more of the values stored in the memory, and optionally display the read value on the display.

In certain embodiments, the hybrid currency teller machine includes an input device for accepting an input value and a writer for writing a new stored value responsive to the input value in the memory.

In certain embodiments, the disclosed technology includes a method of making a hybrid currency banknote, the method including: providing a banknote having visible markings; providing a wafer having a plurality of micro-transfer printable light-controlling elements; providing a wafer having a plurality of controllers; embedding one or more of the light-controlling elements and at least one controller to the banknote; and electrically connecting the controller to the one or more light-controlling elements and to a power input connection.

In certain embodiments, the method includes micro-transfer printing the light-controlling elements and at least one controller to the banknote.

In certain embodiments, the method includes providing ribbon or thread, micro-transfer printing the light-controlling elements and at least one controller to the ribbon or thread, and integrating the micro-transfer printed ribbon or thread in the banknote.

In certain embodiments, the method includes providing a power source on the banknote and electrically connecting the power source to the power input connection.

In certain embodiments, the controller includes a memory and comprising providing the memory with a value.

In another aspect, the disclosed technology includes a method of using a hybrid currency banknote according to claim 1, the method including: receiving the banknote; providing power to the power input connection; and viewing light emitted by the one or more light-controlling elements.

In certain embodiments, the method includes inserting the hybrid currency banknote into a teller machine (e.g., as described above).

In certain embodiments, the method includes communicating an identification of the hybrid currency banknote to a remote database and receiving a communication from the database.

In certain embodiments, the communicated identity is recorded by the remote database.

In certain embodiments, the method includes inserting the hybrid currency banknote into a hybrid currency teller machine, entering an input value with the input device, and retrieving the hybrid currency banknote from the hybrid currency teller machine, the hybrid currency banknote having a new stored value responsive to the input value.

In certain embodiments, the new stored value is the difference between a previously stored value and the input value.

In certain embodiments, the method includes communicating an identification of the hybrid currency banknote to a remote database and receiving a communication from the remote database.

In certain embodiments, the received communication is an approval or disapproval and the hybrid currency banknote has a new stored value responsive to the input value only if an approval is received.

In certain embodiments, the input value represents a desired transaction and the remote database records the transaction.

In certain embodiments, the hybrid currency banknote comprises a power source connected to the power input connection.

In certain embodiments, the power source is a piezoelectric power source and comprising squeezing the piezoelectric power source.

In certain embodiments, the power source is a photovoltaic power source and comprising exposing the photovoltaic power source to photons.

In another aspect, the disclosed technology includes a hybrid currency banknote, including: a banknote having visible markings; one or more energy output devices embedded in or on the banknote; a controller embedded in or on the banknote electrically connected to the one or more energy output devices for controlling the one or more energy output devices; and a power input connection electrically connected to the controller, or to the one or energy output devices, or both.

In certain embodiments, the one or energy output devices is one or more of one or more light-emitting elements, a sound-emitting element, and a vibration element.

In another aspect, the disclosed technology includes a hybrid document, including: a document having visible markings; one or more light-emitting elements embedded in or on the document; a controller embedded in or on the banknote electrically connected to the one or more light-controlling elements for controlling the one or more light-controlling elements; and a power input connection electrically connected to the controller, or one or more light-emitting elements, or both.

In certain embodiments, the light-controlling elements are light-emitting elements, light-reflecting elements, inorganic light-emitting diodes, organic light-emitting diodes, micro-electromechanical reflective elements, reflective electrophoretic elements, or reflective electrochromic display elements.

In certain embodiments, the hybrid document includes a power source connected to the power input connection.

In certain embodiments, the power source is a piezoelectric power source or a photovoltaic power source.

In certain embodiments, the power source is indicated by the visible markings, the power source forms a part of the visible markings, or the power source is obscured by the visible markings.

In certain embodiments, the power source comprises a plurality of electrically connected individual power source components.

In certain embodiments, the hybrid banknote includes a power convertor connected to the power input connection and the controller or one or more light-controlling elements.

In certain embodiments, the banknote is a government-issued banknote indicated by the visible markings.

In certain embodiments, the banknote includes a flexible substrate that includes paper, plastic, or impregnated paper, and the one or more light-controlling elements and the controller are printed on the flexible substrate.

In certain embodiments, the banknote includes a ribbon or thread woven into the banknote and the and the one or more light-controlling elements and the controller are printed on the ribbon or thread.

In certain embodiments, the ribbon or thread or portions of the ribbon or thread are at least partially electrically conductive or include conductive wires.

In certain embodiments, the one or more light-controlling elements, the controller, or both the one or more light-controlling elements and the controller include at least a portion of a tether.

In certain embodiments, the one or more light-controlling elements are disposed in a location corresponding to a portion of the visible markings to highlight or otherwise indicate the portion of the visible markings.

In certain embodiments, the one or more light-controlling elements are disposed to form a graphic indicator.

In certain embodiments, the graphic indicator is any of one or more of a number, a letter, and a pictogram.

In certain embodiments, the graphic indicator indicates a value, a date, or a person.

In certain embodiments, the hybrid banknote includes one or more light pipes located in association with the one or more light-controlling elements.

In certain embodiments, the light pipes include portions that leak light at desired locations.

In certain embodiments, the one or more light pipes are disposed in a location or arranged in a pattern corresponding to a portion of the visible markings to highlight or otherwise indicate the portion of the visible markings.

In certain embodiments, the one or more light pipes are disposed to form a graphic indicator.

In certain embodiments, the graphic indicator is any of one or more of a number, a letter, and a pictogram.

In certain embodiments, the graphic indicator indicates a value, a date, or a person.

In certain embodiments, the controller controls the one or more light-controlling elements to flash or flash sequentially.

In certain embodiments, the one or more light-controlling elements include inorganic light-emitting diodes that emit different colors of light.

In certain embodiments, the different colors of light include red, green, and blue.

In certain embodiments, the one or more light-controlling elements forms a display or a two-dimensional array.

In certain embodiments, the visible markings do not include a value.

In certain embodiments, the one or more light-controlling elements are arranged to indicate a value.

In certain embodiments, the controller includes protective layers disposed over at least one or more portions of the controller.

In certain embodiments, the controller includes a circuit having a memory that stores a value and the circuit causes the one or more light-controlling elements to indicate the value or the memory stores an electronic serial number.

In certain embodiments, the memory is a read-only memory.

In certain embodiments, the memory is a write-once memory that stores multiple values in memory locations that are ordered in a sequential order.

In certain embodiments, the banknote is adapted to a teller machine that writes a value into the memory in a location sequentially after the previous written value.

In certain embodiments, the one or more light-controlling elements or the controller has a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm.

In another aspect, the disclosed technology includes a method of making a hybrid document, including: providing a banknote having visible markings; providing a wafer having a plurality of micro-transfer printable light-controlling elements; providing a wafer having a plurality of controllers; embedding one or more of the light-controlling elements and at least one controller to the document; and electrically connecting the controller to the one or more light-controlling elements and to a power input connection.

In certain embodiments, the method includes micro-transfer printing the light-controlling elements and at least one controller to the document.

In certain embodiments, the method includes providing ribbon or thread, micro-transfer printing the light-controlling elements and at least one controller to the ribbon or thread, and integrating the micro-transfer printed ribbon or thread in the document.

In certain embodiments, the method includes providing a power source on the document and electrically connecting the power source to the power input connection.

In certain embodiments, the controller includes a memory and comprising providing the memory with a value.

In another aspect, the disclosed technology includes a method of using a hybrid document (e.g., as described above), including: receiving the document; providing power to the power input connection; and viewing light emitted by the one or more light-controlling elements.

In certain embodiments, the method includes communicating an identification of the hybrid document to a remote database and receiving a communication from the database.

In certain embodiments, the communicated identity is recorded by the remote database.

In another aspect, the disclosed technology includes a hybrid document, including: a banknote having visible markings; one or more energy output devices embedded in or on the banknote; a controller embedded in or on the banknote electrically connected to the one or more energy output devices for controlling the one or more energy output devices; and a power input connection electrically connected to the controller, or to the one or energy output devices, or both.

In certain embodiments, the one or energy output devices is one or more of one or more light-emitting elements, a sound-emitting element, and a vibration element.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 2 is a schematic diagram according to an embodiment of the present invention;

FIG. 3 is a plan view of the front and back sides of another embodiment of the present invention;

FIG. 4 is an illustration of a light pipe according to an embodiment of the present invention;

Figure 1:
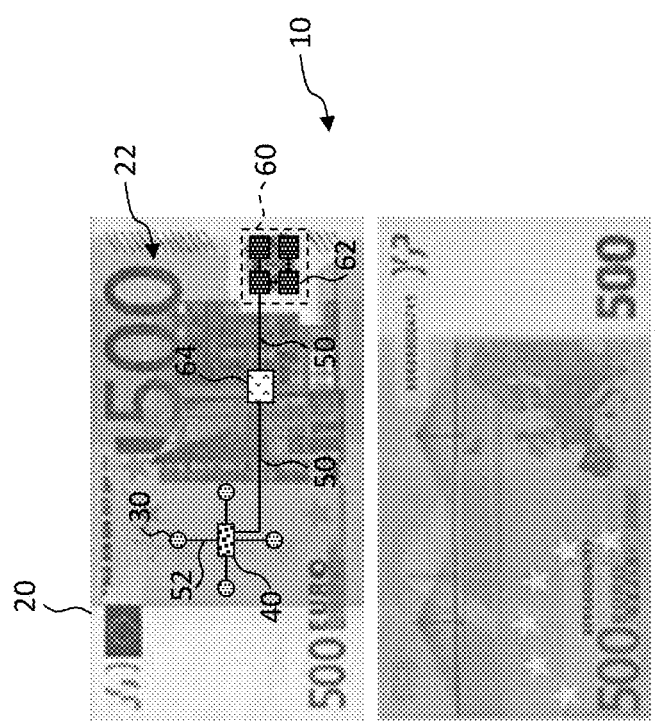
FIG. 1 is a plan view of the front and back sides of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Referring to FIG. 1, in an embodiment of the present invention a hybrid document, for example a currency banknote 10, includes a banknote 20 having visible markings 22. The banknote 20 can be a government-issued banknote 20 indicated by the visible markings 22 and can comprise a flexible substrate that includes paper, plastic, or impregnated paper. One or more light-controlling elements 30 are embedded in or on the banknote 20 and can be printed on the flexible substrate. A controller 40 is embedded in or on the banknote 20 and electrically connected to the one or more light-controlling elements 30 for controlling the one or more light-controlling elements 30. A power input connection 50 is electrically connected to the controller 40, one or more light-controlling elements 30, or both. In a further embodiment, a power source 60 is electrically connected to the power input connection 50, for example directly to the power input connection 50 (not shown) or through a power convertor 64 (as shown). The power source 60 and the controller 40 can be a common element or a common circuit and the controller 40 can be a power conditioning circuit or can include analog or digital control circuitry. The controller 40, the light-controlling elements 30 and the power input connection 50 can be electrically connected, for example with wires 52. Multiple controllers 40 can be used to provide redundancy, reduce failures, and increase lifetime. The multiple controllers 40 can be connected in parallel with common input, output, power, and ground connections. In other embodiments, the controller 40 can include multiple circuits in multiple integrated circuits and include discrete components, such as capacitors and resistors that can provide additional control support, for example as timing or trimming devices to support light-controlling element 30 flash rates, filter devices such as acoustic wave devices (either bulk or surface).

In embodiments of the present invention, the hybrid document can be any document for which authentication is a useful feature, for example government-issued documents such as currency banknotes 20, passports, driver licenses, or identification documents. The hybrid document can also be a financial instrument (e.g., banknotes, bonds, bearer bonds, or stock certificates) issued by a financial organization, including central banks, private banks, investment banks, or commercial entities such as corporations.

The power source 60 can be a piezoelectric power source or a photovoltaic power source and the power convertor 64 can convert the power provided by the power source 60 to a form that is used by the controller 40, the light-controlling elements 30, or both. The power convertor 64 can include power storage, for example using capacitors such as thin-film capacitors with a high-K dielectric to provide power over a time period. The capacitors can be distributed, for example located among the power components 62. Output diodes can be used to isolate the power supplies 60 or light-controlling elements 30. In one arrangement, the power source 60 is indicated by the visible markings 22, the power source 60 forms a part of the visible markings 22, or the power source 60 is obscured by the visible markings 22. Multiple power sources 60 and multiple power convertors 64 can be used to provide redundancy.

In an embodiment, the power source 60 comprises a plurality of electrically connected but physically separated individual power components 62. The power components 62 can be arranged in a 2-d array (as shown) or a 1-d array (not shown) and operated by squeezing, waving, or sliding an object across the power components 62. The power components 62 can be a group of elements that are operated at the same time with a single action, for example pressure applied to all of the power components 62 simultaneously. The power components 62 can be electrically arranged in series to achieve a desired voltage or in parallel to achieve a desired current or some combination of series and parallel to achieve the desired power characteristics.

The light-controlling elements light-controlling elements 30 can be inorganic light-emitting diodes 30 such as micro-light-emitting diodes suitable for micro-transfer printing, for example made on a semiconductor wafer adapted to the manufacture of inorganic light-emitting diodes 30. In general, the light-controlling elements 30 can be light-emitting elements, light-reflecting elements, inorganic light-emitting diodes, organic light-emitting diodes, micro-electromechanical reflective elements, reflective electrophoretic elements, or reflective electrochromic display elements. For clarity of exposition, the light-controlling elements 30 of the present invention are referred to below as inorganic light-emitting diodes (iLEDs) 30. However, in various embodiments the present invention contemplates the use of a corresponding variety of light-controlling elements 30. In another embodiment, the light-controlling elements 30 are also energy harvesting elements (for example silicon photodiodes) and provide power as part of the power source 60.

The controller 40 can also be an integrated circuit, for example a small chiplet, suitable for micro-transfer printing. The controller 40 can include digital circuits or logic (for example CMOS circuits) and power circuits (for example for driving an LED). The controller 40 can include information storage circuits, a state machine, or a stored program machine to implement the desired functionality of the hybrid currency banknote 10. The controller 40 can read or write information such as currency values, process information, respond to input and provide output. The power connection 50 can be directly connected to the controller 40 (as shown) or to the iLEDs 30, or both. Alternatively, the power connection 50 can indirectly connect to the controller 40 or the iLEDs 30, or both through the power convertor 64 (not shown). The power connection 50 can be an electrical conductor, for example small wires 52, and can include power connection pads that, when electrically connected to a power source, (such as a 3.3-volt, 5-volt, or 12-volt power source), provides power to the controller 40 and iLEDs 30 to enable them to function. The power source can be external (not shown) or can be provided by the internal power source 60.

It can be desirable to fold or spindle the hybrid currency banknote 10 of the present invention. To facilitate such a manipulation, in an embodiment of the present invention, the power source 60 comprises a plurality of electrically connected smaller individual power components 62. A single large power source 60 can be too rigid to readily fold or curve, whereas an arrangement of individual smaller physically separate power components 62 can allow folding between the smaller power components 62, even if the smaller power components 62 themselves are relatively rigid.

In a further embodiment, the iLEDs 30 and controller 40 are too small to be readily visible with the unaided human eye. Furthermore, the iLEDs 30 and controller 40 can be located in areas of the banknote 20 that include visible markings 22 to further obscure the presence of the iLEDs 30 and controller 40, as well as any wires 52. Similarly, the power source 60 or an arrangement of individual smaller power components 62 can be obscured by the visible markings 22. In one embodiment, any of the iLEDs 30, controller 40, wires 52, power source 60, power components 62, or power convertor 64 are marked with visible markings 22. For example, ink can be printed over the iLEDs 30, controller 40, wires 52, power source 60, power components 62, or power convertor 64 to obscure them or otherwise make them a part of the visible markings 22 on the banknote 20. Since the iLEDs 30, controller 40, wires 52, power source 60, power components 62, or power convertor 64 can each be very small, for example having a size in the micron range, they can be effectively invisible to the unaided human eye. For example, the one or more inorganic micro light-emitting diodes 30 or the controller 40 of the hybrid currency banknote 10 can have a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm.

In one embodiment of the present invention, the iLEDs 30 and controller 40 are directly printed onto a banknote 20, for example before or after the banknote 20 is printed with ink. In this embodiment, wires 52 can be woven into the banknote 20 in predetermined locations at which the iLEDs 30 and controller 40 are printed before or after the iLEDs 30 and controller 40 are printed. Referring to FIG. 2 in another embodiment, the banknote 20 includes a metalized or metallic ribbon 70 or thread, for example Mylar, with a pattern of electrical conductors or wires 52. The iLEDs 30 and controller 40 are printed, for example micro-transfer printed, onto the ribbon 70 before or after the electrical conductors such as wires 52 are formed, patterned, or impressed into the ribbon 70 to make an electrical circuit. In such an embodiment, the iLEDs 30 and controller 40 can include at least a portion of a tether, resulting from the fracturing of a tether on a source wafer from which the iLEDs 30 and controller 40 originate and that connects the iLEDs 30 and controller 40 to an anchor on the source wafer in the micro-transfer printing process. The ribbon 70 or thread is then incorporated into the banknote 20 to make an embodiment of the hybrid currency banknote 10 of the present invention. The power source 60 (and any power components 62), power convertor 64, or power input connection 50 can likewise be formed in the ribbon 70. Alternatively, some components can be on the ribbon 70 and others not on the ribbon 70, in particular the power source 60.

Referring to FIG. 3, in an embodiment the one or more inorganic LEDs 30 are disposed in a location corresponding to a portion of the visible markings 22 to highlight or otherwise indicate the portion of the visible markings 22. For example, the one or more inorganic LEDs 30 can underline or surround a graphic element of the visible markings 22. As shown in FIG. 3, the one or more inorganic LEDs 30 outline the numeral 5. Thus, the one or more inorganic LEDs 30 can be disposed to form a graphic indicator such as any of one or more of a number, a letter, and a pictogram. The graphic indicator can have semantic content, for example indicating a value, a date, or a person.

Referring next to FIG. 4, one or more light pipes 32 are located in association with the one or more inorganic light-emitting diodes 30 to transmit light emitted by the inorganic light-emitting diodes 30 through the light pipes 32 and emit the transmitted light from the opposite end of the light pipe 32. In an embodiment, the light pipes 32 include portions that leak light at desired locations, for example by purposefully forming nicks, scratches, or other forms of light diffusers 34 in the light pipes 32 to allow light to leak from the light pipe 32. Thus, the arrangement of the light pipes 32 can also correspond to a portion of the visible markings 22 to highlight or otherwise indicate the portion of the visible markings 22, form a graphic indicator, or form any one or all of a number, a letter, and a pictogram to indicate a value, a date, or a person.

Figure 5:
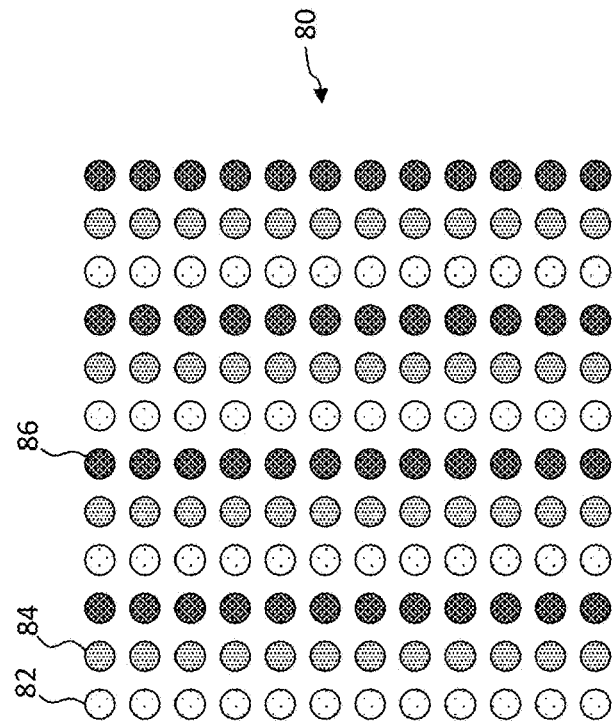
FIG. 5 is a schematic illustration of a display according to an embodiment of the present invention.

The controller 40 can control the one or more inorganic light-emitting diodes 30 to flash or sequentially flash individual iLEDs 30, forming spatial, temporal, or temporal-spatial light patterns. Referring to FIG. 5, in an embodiment, the inorganic light-emitting diodes 30 can emit different colors of light. For example, a red light-emitting diode 82 can emit red light, a green light-emitting diode 84 can emit green light, and a blue light-emitting diode 86 can emit blue light. The different inorganic light-emitting diodes 30 can be arranged spatially to form a display 80, a two-dimensional array, or a graphic element.

Figure 6:
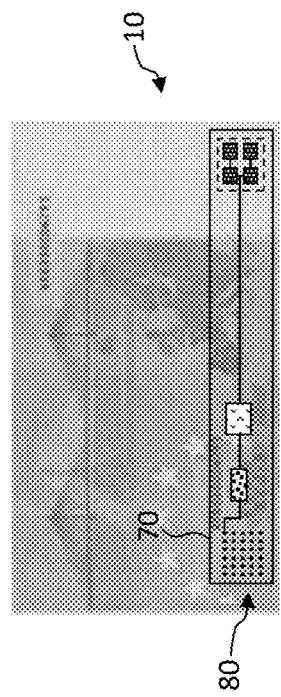
FIG. 6 is a schematic diagram of one side of a hybrid currency banknote according to another embodiment of the present invention.
Figure 7:
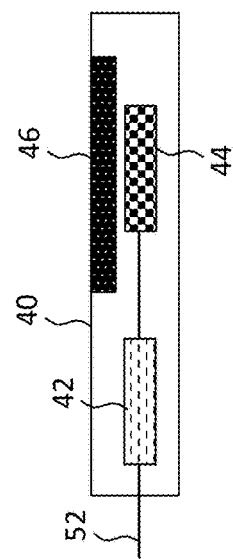
FIG. 7 is a schematic diagram illustrating a controller and circuit according to another embodiment of the present invention.

In another embodiment of the present invention and referring to FIG. 6, the hybrid currency banknote 10 includes visible markings 22 that do not include a value. Such a hybrid currency banknote 10 can be a non-denominational banknote that either has an assigned value or a variable value stored in a memory 44 in the controller 40, as shown in FIG. 7. Referring to FIG. 7, an assigned value can be provided by providing a circuit 42 and memory 44 in the controller 40 or providing circuits 42, such as the memory 44, connected to the controller 40. The memory 44 can be a read-only memory that encodes a desired assigned value. The assigned value can be a currency value or can include an electronic serial number, or both. The assigned value can be discovered by providing power to the power input connection 50. The power energizes the controller 40 which, in turn, controls the iLEDs 30 to display or otherwise indicate the assigned value. The memory 44 can be protected from overwriting, damage, or alternative discovery by protective layers such as a protective shield 46 formed over the memory 44 to discourage exposure by light and protect the memory 44 from heat. The shield 46 can be a light shield, a light reflector, a light absorber, or a heat conductor.

Figure 9:
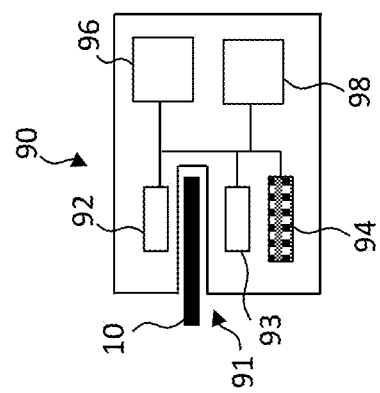
FIG. 9 is a schematic of a teller machine according to an embodiment of the present invention.
Figure 8:
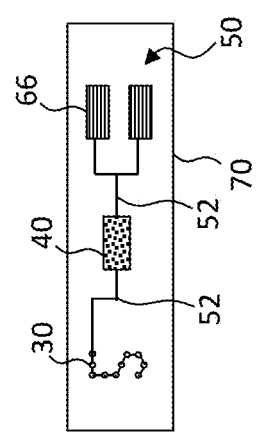
FIG. 8 is a schematic diagram illustrating a circuit according to another embodiment of the present invention.

In the case in which the assigned value is variable, the memory 44 can be a write-once memory that stores multiple values in memory locations that are ordered in a sequential order, for example by memory address. The write-once memory can, for example, employ fuses that are electrically destroyed and cannot be rewritten. Alternatively, the memory 44 can be a non-volatile read-write memory. In this case, the value stored by the hybrid currency banknote 10 can change over time. The current value can be discovered by providing power to the power input connection 50. The power energizes the controller 40 which, in turn, controls the iLEDs 30 to display or otherwise indicate the current value. The current value can be modified by, for example, a teller machine. Referring to FIGS. 8 and 9, in an embodiment of the present invention, the hybrid currency banknote 10 is adapted to a hybrid currency teller machine 90 that writes a value into the memory 44 in a memory storage location having an address sequentially after the address of a previous written value. As shown in FIG. 8, the power input connection 50 includes or is connected to power connection pads 66 that can be contacted by an external power source to provide power to the controller 40 and iLEDs 30 through wires 52. Referring to FIG. 9, a hybrid currency teller machine 90 includes a slot 91 into which a hybrid currency banknote 10 can be inserted. Once inserted into the hybrid currency teller machine 90, the hybrid currency banknote 10 is read by a reader 92 that can access the controller 40 or memory 44, for example by contacting electrical conductors to the power connection pads. (Only two power connection pads 66 are illustrated, but one or more power connection pads 66 can be included in various embodiments of the present invention). Once the current value of the hybrid currency banknote 10 is read, it can be displayed, for example on an optional teller machine display 96. If a change in the current value of the hybrid currency banknote 10 is desired, an input value can be input by a user with an input device 94. A teller machine controller 98 can then calculate or otherwise determine a new stored value responsive to the input value and store the new value in the hybrid currency banknote 10, for example by communicating the new stored value to the controller 40 which then writes the new stored value in the memory 44 with a writer 93. In an embodiment, the controller 40 only writes new stored values in the memory 44 that are smaller than the current value. In another embodiment, the controller 40 can write new stored values in the memory 44 that are larger than the current value, or that are larger than the current value but are limited to a maximum value. The change in current value of the hybrid currency banknote 10 can represent or be the result of a financial transaction, for example a purchase or a financial exchange with or facilitated by a financial institution such as a bank. Read-only memories, write-once memories, and read/write memories together with controllers and read/write circuitry (e.g., reader 92 and writer 93) can be formed in integrated circuits and electrical circuits. Devices for currency handling, optical inspection, making physical electronic contacts, displays, input devices (such as keyboards or touch screens) can be made using electromechanical, electronic, and optical technologies.

Figure 10:
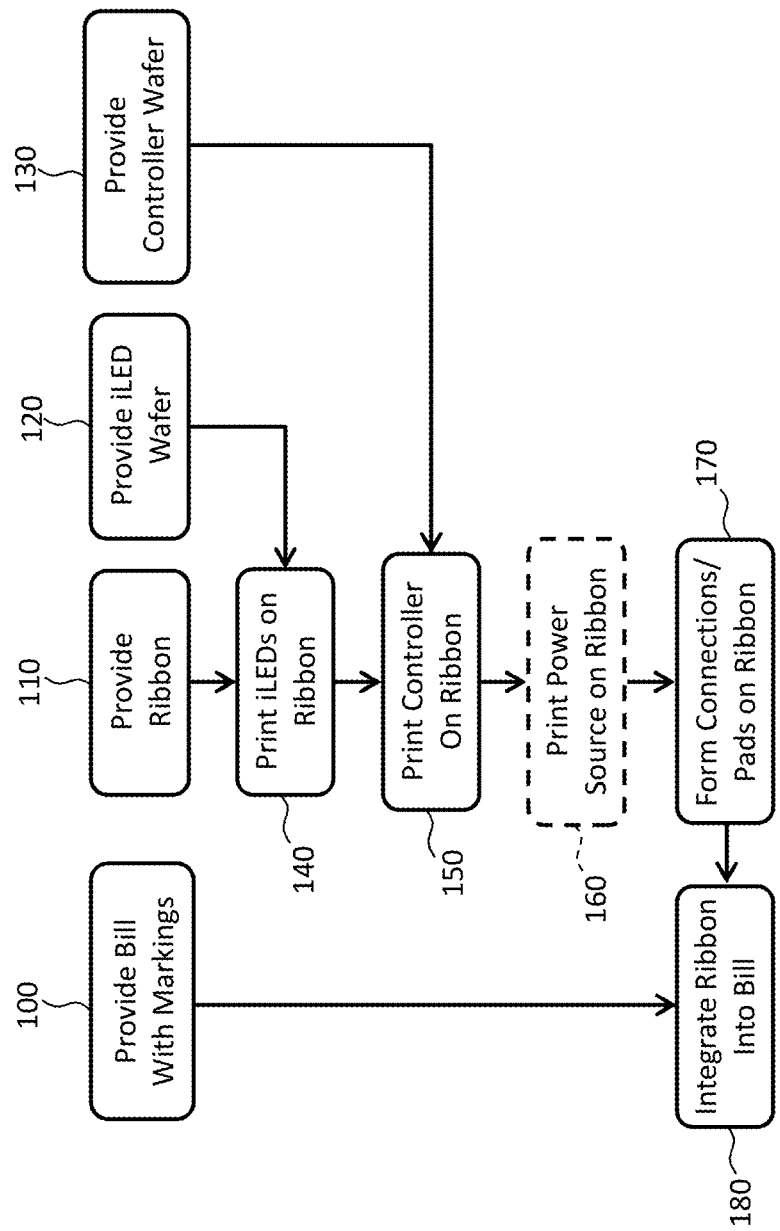
FIGS. 10-12 are flow charts illustrating methods of the present invention.

Referring to FIG. 10, a hybrid currency banknote 10 of the present invention can be made by providing a banknote 20 with markings in step 100, for example by printing on a high-quality paper with ink using intaglio printing. A ribbon 70 is provided in step 110, an inorganic LED wafer having micro-transfer printable iLEDs 30 is provided in step 120, and a controller wafer having micro-transfer printable controllers 40 is provided in step 130. The iLEDs 30 are micro-transfer printed from the inorganic LED wafer onto the ribbon 70 using a stamp to fracture tethers connecting the iLEDs 30 to the inorganic LED wafer leaving at least a portion of a tether on the iLEDs 30 in step 140. The controllers 40 are micro-transfer printed from the controller wafer onto the ribbon 70 using a stamp to fracture tethers connecting the controllers 40 to the controller wafer leaving at least a portion of a tether on the controllers 40 in step 150. Optionally, the power source 60 is similarly micro-transfer printed to the ribbon 70 in step 160. Power connection pads 66, wires 52 and any other necessary electrical conductors are formed in step 170 to make an electronic circuit having electrical conductors. The electrical conductors can be provided before or after the iLEDs 30 and controllers 40 are micro-transfer printed. The ribbon 70 can be further processed, for example to provide environmental robustness by coating with protective layers. The ribbon 70 is then integrated into the banknote 20 in step 180 to make the hybrid currency banknote 10 of the present invention. The hybrid currency banknote 10 can be further processed, for example by over coating or printing to provide environmental robustness, decoration, or to obscure the micro-transfer printed elements.

Figure 11:
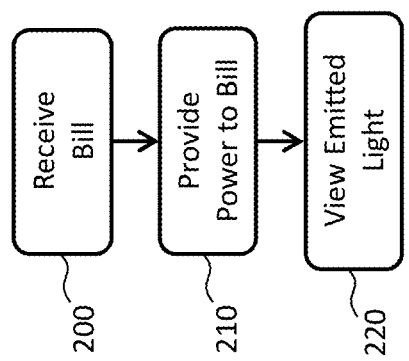

Referring to FIG. 11, the hybrid currency banknote 10 of the present invention can be used by first receiving the hybrid currency banknote 10 in step 200, providing power to the hybrid currency banknote 10 in step 210, and viewing light emitted by the hybrid currency banknote 10 in step 220. Power can be provided by connecting the hybrid currency banknote 10 to an external power source (e.g., using the power connection pads 66), squeezing a piezoelectric power source 60, or exposing a photovoltaic power source 60 to light.

Figure 12:
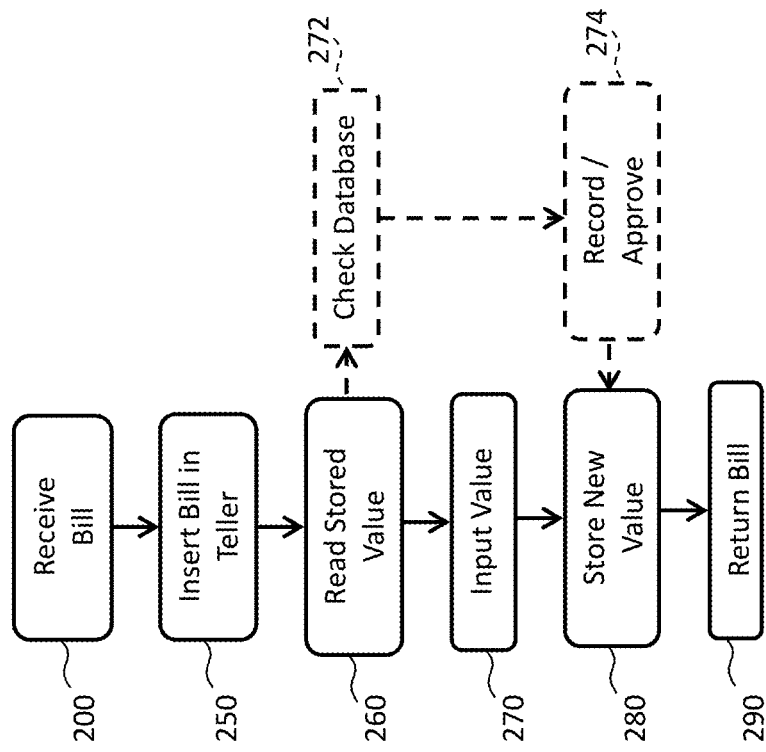

Referring to FIG. 12, an assigned or current value can be programmed into the controller 40 or an associated memory 44 (also micro-transfer printed if it is a separate integrated circuit or chiplet) either before or after the controller 40 or memory 44 is micro-transfer printed. Alternatively, an external device such as a hybrid currency teller machine 90 can communicate with the controller to write an assigned or current value to the hybrid currency banknote 10. For example, the hybrid currency banknote 10 can be received in step 200, inserted into the hybrid currency teller machine 90 in step 250, the current value read by the reader 92 in step 260, an input value input by the input device 94 in step 270, a new stored value responsive to the input value computed by the teller machine controller 98 and stored by the writer 93 in step 280 and the hybrid currency banknote 10 returned in step 290. Optionally, the hybrid currency teller machine 90 can also communicate with a central or remote database (step 272) to establish the legitimacy of the hybrid currency banknote 10, track its use or location, or approve a transaction and record or approve the transaction (step 274). The communication can include an electronic serial number.

U.S. patent application Ser. No. 14/743,981, filed Jun. 18, 2015, entitled *Micro Assembled LED Displays and Lighting Elements*, incorporated herein by reference describes micro-transfer printing structures and processes useful with the present invention. For a discussion of micro-transfer printing techniques see also U.S. Pat. Nos. 8,722,458, 7,622,367 and 8,506,867, each of which is hereby incorporated by reference in its entirety. Micro-transfer printing using compound micro assembly structures and methods can also be used with the present invention, for example, as described in U.S. patent application Ser. No. 14/822,868, filed Aug. 10, 2015, entitled *Compound Micro-Assembly Strategies and Devices*, which is hereby incorporated by reference in its entirety.

Figure 13:
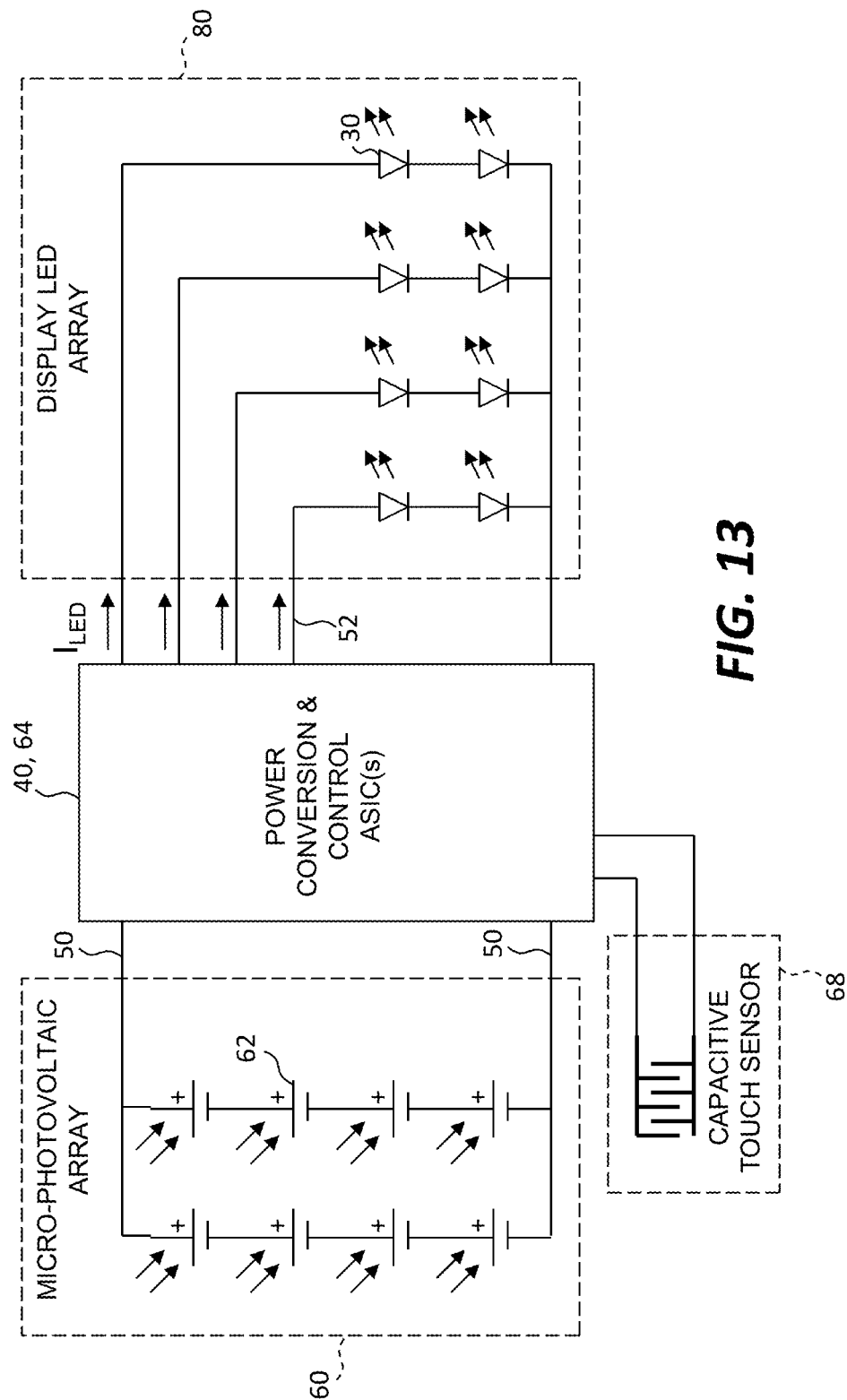
FIGS. 13-15 are schematic diagrams according to embodiments of the present invention.
Figure 14:
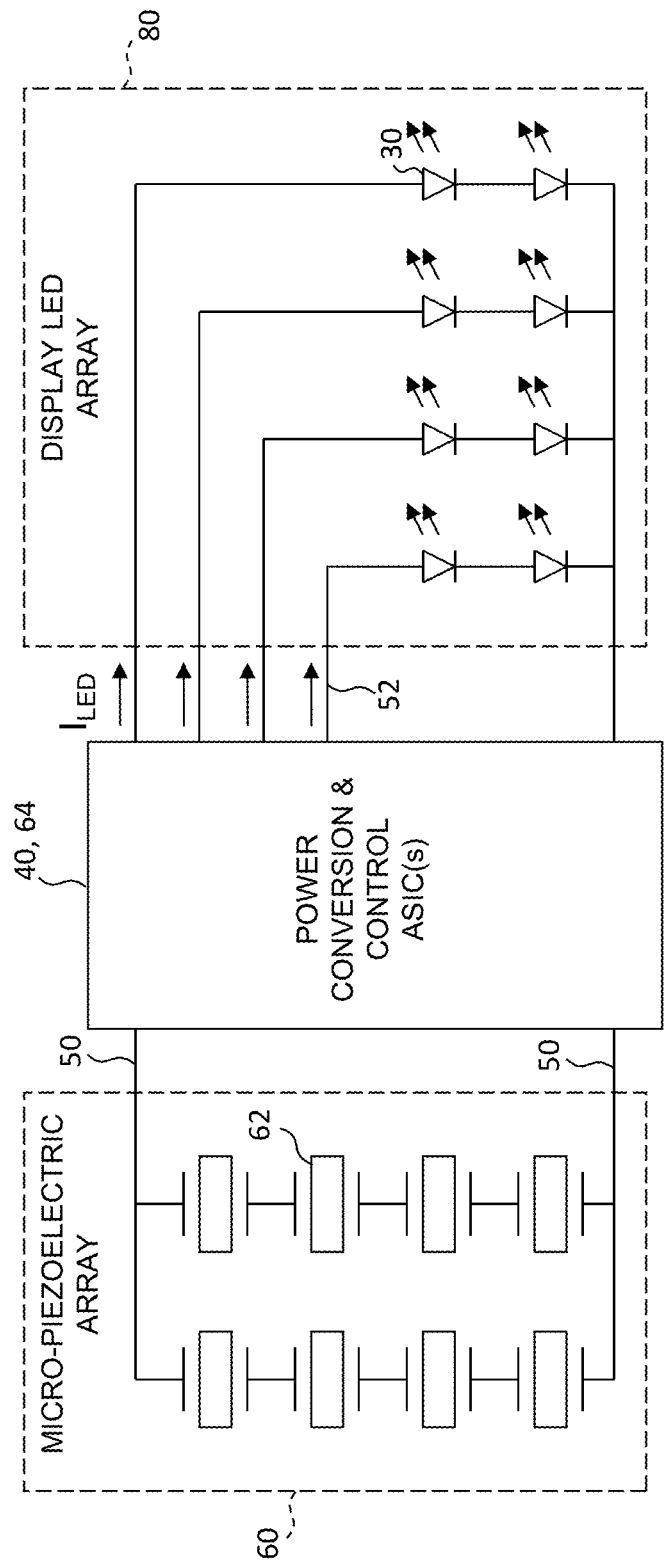

A simplified schematic of an embodiment of the present invention is illustrated in FIGS. 13 and 14. As shown in these Figures, a power source 60 includes two parallel groups of four series-connected power components 62 electrically connected to the power connection 50 and the power convertor 64 and controller 40. The power convertor 64 and controller 40 can be a single component, as shown, or include multiple different components such as separate integrated circuits. Control current from the power convertor 64 and controller 40 drives the iLEDs 30 of the display 80. A capacitive touch sensor 68 is also included (FIG. 13). In FIG. 13, the power source 60 is a photovoltaic power source.

Figure 15:
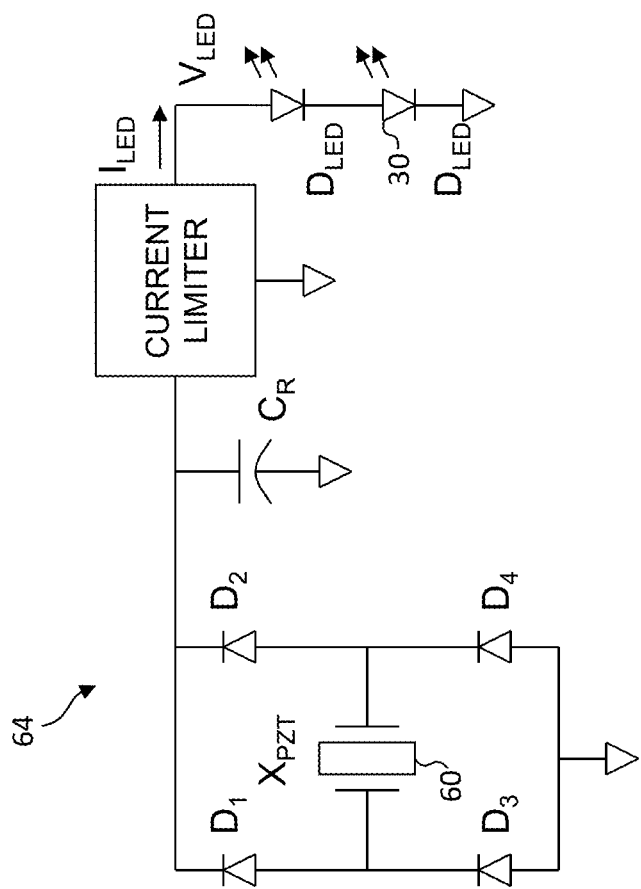

In FIG. 14, the power source 60 is a piezoelectric power source. FIG. 15 illustrates an example power convertor 64 and controller 40 having a four-diode bridge rectifier and storage capacitor $C_R$ providing power from a piezoelectric power source 60 to a current limiter that, in turn, provides current to the iLEDs 30. (The controller 40 can be powered by the power component 60 to control the iLEDs 30, but is not illustrated in FIG. 15. As noted above, the controller 40 and power component 60 can be a common component or circuit or can be separate or individual components or circuits.)

Figure 16:
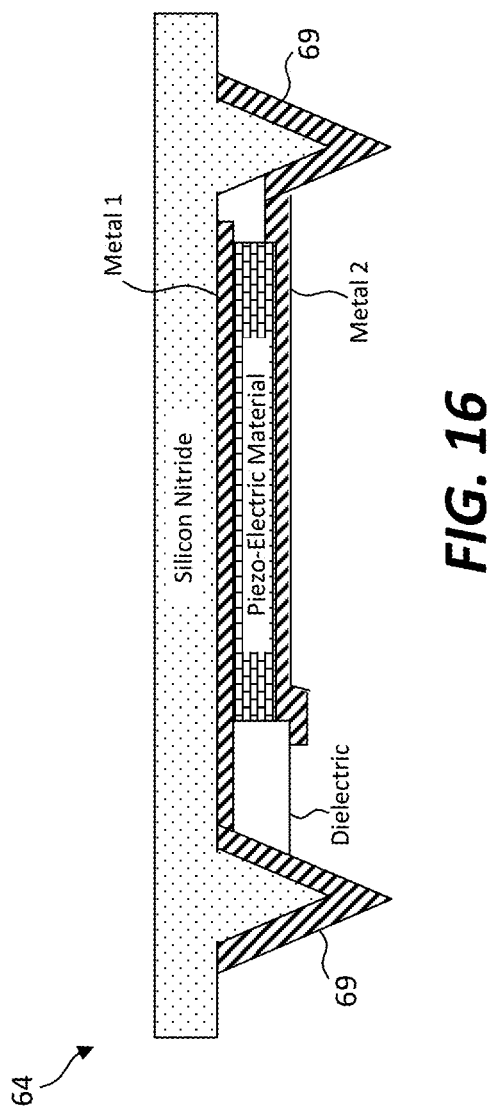
FIG. 16 is a cross section of a piezoelectric power component according to an embodiment of the present invention.

Referring to FIG. 16, a power component 64 can include a dielectric layer such as a silicon nitride layer with a first metal layer providing a first connection post 69 or spike. A piezoelectric material layer is in electrical contact with the first metal layer and, on a side of the piezoelectric material layer opposite the first metal layer, a second metal layer is in electrical contact with a second metal layer and forms a second connection post 69 or spike. The power component 64 of FIG. 16 can be micro-transfer printed onto two conductors (e.g., wires 52) so that the first and second connection posts 69 are in contact with the conductors. The first and second connection posts 69 can pierce or otherwise deform and adhere to the conductors after micro-transfer printing.

Figure 17:
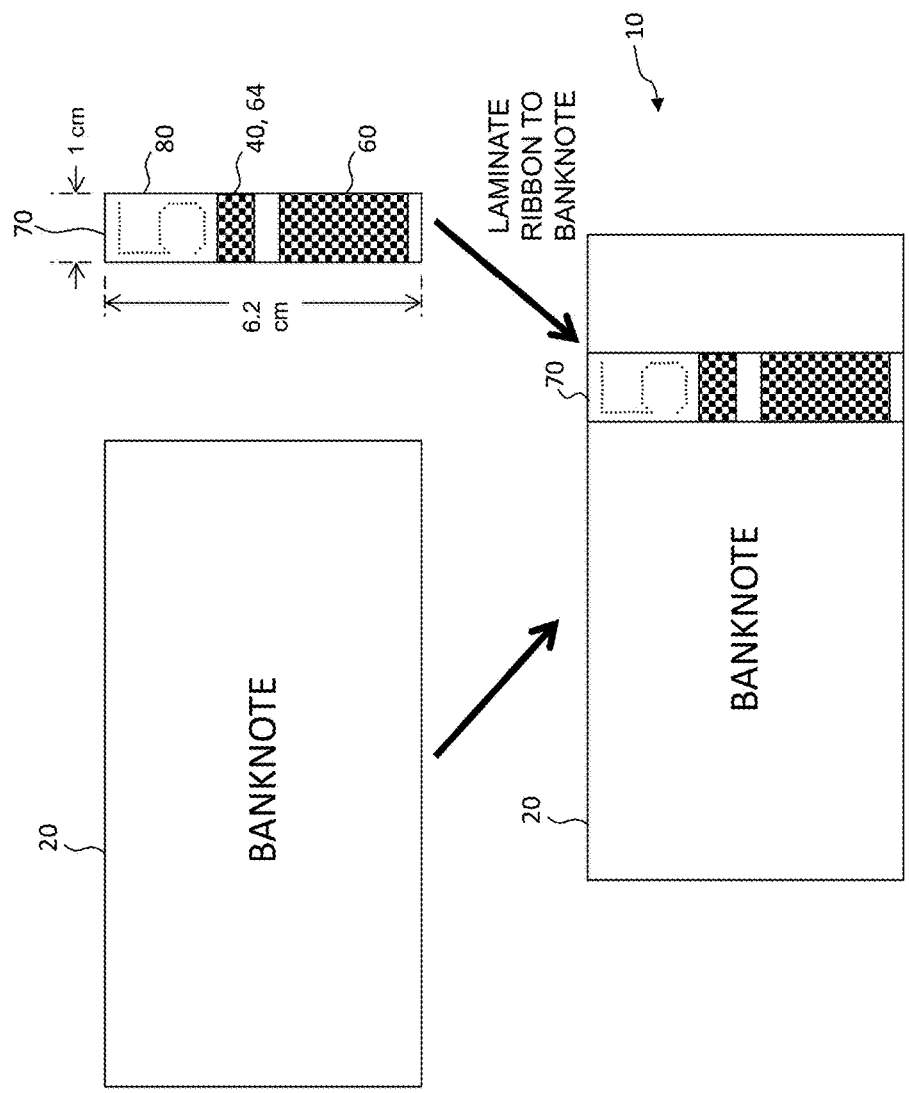
FIG. 17 is a schematic illustration of a method according to an embodiment of the present invention.

FIG. 17 illustrates the process of making a banknote 20 according to an embodiment of the present invention. A printed banknote is provided together with a ribbon 70 having an array of micro-transfer printed iLEDs 30 electrically connected to a controller, a power convertor 64, and a power source 60. The ribbon 70 is laminated or otherwise integrated into the banknote 20 to make a hybrid currency banknote 10.

Figure 18:
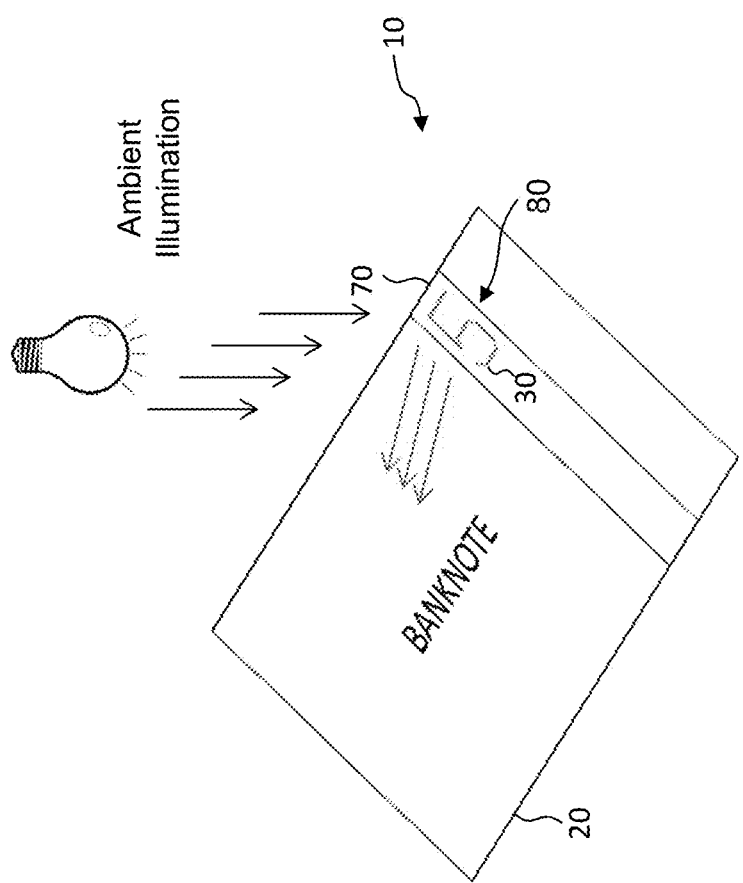
FIGS. 18 and 19 are schematic illustrations of methods of operating an embodiment of the present invention.

As shown in FIG. 18, a hybrid currency banknote 10 of the present invention having a photovoltaic power source 60 can be exposed to ambient illumination to provide power to iLEDs 30 in a display 80, causing the iLEDs 30 to emit light. It has been calculated that conventional ambient office light provides sufficient illumination (e.g., 500 lux) to operate a photovoltaic embodiment of the present invention, including digital control for iLEDs 30 sequencing, for example flashing. Photovoltaic cells (e.g., power components 62) can be GaAs having lateral dimensions of 50µ by 50µ and providing 66 µW in an array of 50,000 power components 62 and requiring approximately 1.27 cm². The array of power components 62 can occupy a larger area with a lower fill factor to provide apparent transparency and improved flexibility to the power source 60. A 20×20 array of 400 iLEDs 30 (for example, green-light-emitting iLEDs 30) can provide a readable display 80 in these conditions over a viewing angle of 140 degrees similar to displays found in body-worn electronic devices (e.g., watches, fitness trackers) and can consume 66 µW.

Figure 19:
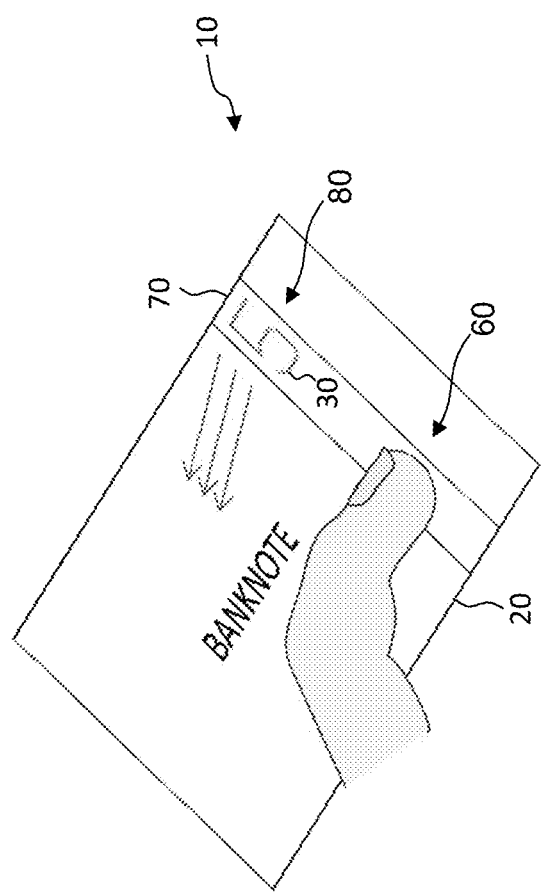

As shown in FIG. 19, a hybrid currency banknote 10 of the present invention having a piezoelectric power source 60 can be pressed or squeezed, for example, by a finger, to provide power to iLEDs 30 in a display 80, causing the iLEDs 30 to emit light. Power is provided both when pressing and releasing (hence the use of a bridge rectifier in FIG. 15). It has been demonstrated that a fingertip having a one square cm area can provide a force of 35 N. Even with a smaller force of 10 N, a piezoelectric power source 60 with a total area of 0.06 cm² provides sufficient power to operate a piezoelectric embodiment of the present invention, including digital control for iLEDs 30 sequencing, for example flashing. The array of power components 62 can occupy a larger area (e.g., 0.5 cm² with a lower fill factor to provide apparent transparency and improved flexibility to the power source 60.

According to another embodiment of the present invention, a hybrid currency banknote 10 can have one or more energy output devices embedded in or on the banknote. The one or more energy output devices can be one or more of one or more light-emitting elements, a sound-emitting element, and a vibration element. The sound-emitting element can be a piezoelectric speaker and the vibration device can be a piezoelectric device. The elements can be controlled, powered, hidden, constructed, or otherwise provided in ways similar to those of the light-emitting elements 30 discussed at greater length above. Such alternative energy output modalities can be useful for persons with impaired vision.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 10 hybrid currency banknote
20 banknote
22 visible markings
30 inorganic light-emitting diode
32 light pipe
34 light leak/diffuser
40 controller
42 circuit
44 memory
46 shield
50 power input connection
52 wires
60 power source
62 power component
64 power convertor 66 power connection pads
68 capacitive touch sensor
69 connection post
70 ribbon
80 display
82 red inorganic light-emitting diode
84 green inorganic light-emitting diode
86 blue inorganic light-emitting diode
90 hybrid currency teller machine
91 slot
92 reader
93 writer
94 input device
96 optional teller machine display
98 teller machine controller
100 provide banknote with markings step
110 provide ribbon step
120 provide iLED wafer step
130 provide controller wafer step
140 micro-transfer print iLEDs on ribbon step
150 micro-transfer print controller on ribbon step
160 optional micro-transfer print power source on ribbon step
170 form connections/pads on ribbon step
180 integrate ribbon in banknote step
200 receive banknote step
210 provide power to banknote step
220 view emitted light step
250 insert banknote in teller step
260 read stored value step
270 input value step
280 store new value step
290 return banknote step

What is claimed is:

1. A hybrid currency banknote, comprising:
a flexible banknote having visible markings;
one or more relatively rigid inorganic light-emitting diodes embedded in or on the banknote;
a controller embedded in or on the banknote electrically connected to the one or more inorganic light-emitting diodes for controlling the one or more inorganic light-emitting diodes; and
a power input connection electrically connected to (i) the controller, or (ii) the one or more inorganic light-emitting diodes, or (iii) both (i) and (ii); and
wherein the one or more inorganic light-emitting diodes each comprises a fractured tether, the controller, or both the one or more inorganic light-emitting diodes and the controller each comprises a fractured tether.

2. The hybrid currency banknote of claim 1, comprising a power source connected to the power input connection.

3. The hybrid currency banknote of claim 2, wherein the power source is a piezoelectric power source or a photovoltaic power source.

4. The hybrid currency banknote of claim 2, wherein the power source is indicated by the visible markings, the power source forms a part of the visible markings, or the power source is obscured by the visible markings.

5. The hybrid currency banknote of claim 2, wherein the power source comprises a plurality of electrically connected individual power source components.

6. The hybrid currency banknote of claim 1, comprising a power convertor connected to the power input connection and the controller or the one or more tight-controlling elements inorganic light-emitting diodes to convert the power provided from the power input connection to a form that is used by the controller or the inorganic light-emitting diodes.

7. The hybrid currency banknote of claim 1, wherein the banknote is a government-issued banknote indicated by the visible markings.

8. The hybrid currency banknote of claim 1, wherein the banknote includes a flexible substrate that includes paper, plastic, or impregnated paper, and the one or more inorganic light-emitting diodes and the controller are printed on the flexible substrate.

9. The hybrid currency banknote of claim 1, wherein the banknote includes a ribbon or thread woven into the banknote and the one or more inorganic light-emitting diodes and the controller are printed on the ribbon or thread.

10. The hybrid currency banknote of claim 9, wherein the ribbon or thread or portions of the ribbon or thread are at least partially electrically conductive or include conductive wires.

11. The hybrid currency banknote of claim 1, wherein the one or more inorganic light-emitting diodes are disposed in a location corresponding to a portion of the visible markings to highlight or otherwise indicate the portion of the visible markings.

12. The hybrid currency banknote of claim 1, comprising one or more light pipes located in association with the one or more inorganic light-emitting diodes to transmit light emitted by the inorganic light-emitting diode into the light pipe and emit the transmitted light from the opposite end of the light pipe.

13. The hybrid currency banknote of claim 1, wherein the controller controls the one or more inorganic light-emitting diodes to flash or flash sequentially.

14. The hybrid currency banknote of claim 1, wherein the one or more inorganic light-emitting diodes forms a display or a two-dimensional array.

15. The hybrid currency banknote of claim 1, wherein the controller includes protective layers disposed over at least one or more portions of the controller.

16. The hybrid currency banknote of claim 1, wherein the controller includes a circuit having a memory that stores a value and the circuit causes the one or more inorganic light-emitting diodes to indicate the value or the memory stores an electronic serial number.

17. A method of making a hybrid currency banknote, comprising:
providing a flexible banknote having visible markings;
providing a light-emitting diode wafer having a plurality of relatively rigid micro-transfer printable inorganic light-emitting diodes connected by light-emitting diode tethers to the wafer;
providing a controller wafer having a plurality of controllers connected by controller tethers to the wafer;
micro-transfer printing at least one of the plurality of controllers and one or more of the plurality of inorganic light-emitting diodes from the controller wafer and the light-emitting diode wafer, respectively, with a stamp, thereby (i) fracturing each light-emitting diode tether that connected the one or more of the plurality of inorganic light-emitting diodes to the light-emitting diode wafer and each controller tether that connected the at least one of the plurality of controllers to the controller wafer and (ii) embedding the one or more of the plurality of inorganic light-emitting diodes and the at least one of the plurality of controllers in or on the banknote; and electrically connecting the at least one of the plurality of controllers to the one or more of the plurality of inorganic light-emitting diodes and to a power input connection.

* * * * *